(12) United States Patent
Aram

(10) Patent No.: US 9,843,289 B2
(45) Date of Patent: Dec. 12, 2017

(54) MEMORYLESS COMMON-MODE INSENSITIVE AND LOW PULLING VCO

(71) Applicant: ETHERTRONICS, INC., San Diego, CA (US)

(72) Inventor: Farbod Aram, Los Altos Hills, CA (US)

(73) Assignee: ETHERTRONICS, INC., San Diego, CA (US)

( * ) Notice: Subject to any disclaimer, the term of this patent is extended or adjusted under 35 U.S.C. 154(b) by 155 days.

(21) Appl. No.: 14/989,566

(22) Filed: Jan. 6, 2016

(65) Prior Publication Data

US 2016/0197582 A1 Jul. 7, 2016

Related U.S. Application Data

(63) Continuation-in-part of application No. 14/745,261, filed on Jun. 19, 2015, now Pat. No. 9,543,916.

(Continued)

(51) Int. Cl.
*H03F 1/22* (2006.01)
*H03B 5/12* (2006.01)
*H03G 1/00* (2006.01)
*H03F 1/32* (2006.01)
*H03F 3/45* (2006.01)

(52) U.S. Cl.
CPC ......... *H03B 5/1293* (2013.01); *H03B 5/1228* (2013.01); *H03F 1/3205* (2013.01); *H03F 3/45179* (2013.01); *H03F 3/45183* (2013.01); *H03G 1/0005* (2013.01); *H03F 2203/45306* (2013.01); *H03F 2203/45481* (2013.01)

(58) Field of Classification Search
CPC .................................. H03F 1/22; H03F 3/191
USPC ........................................ 330/311, 305, 302
See application file for complete search history.

(56) References Cited

U.S. PATENT DOCUMENTS 6,680,657 B2  1/2004  Wang
7,205,837 B2  4/2007  Cohen
(Continued)

OTHER PUBLICATIONS

The International Search Report and the Written Opinion of the International Searching Authority for International Application No. PCT/US2015/036815, dated Sep. 30, 2015.

(Continued)

*Primary Examiner* — Henry Choe
(74) *Attorney, Agent, or Firm* — Coastal Patent Law Group, P.C.

(57) ABSTRACT

A voltage controlled oscillator (VCO) is disclosed. The VCO includes an active device. The VCO comprises an active device, wherein the active device further includes an n-type transistor having a drain, gate and bulk; a p-type transistor having a drain, gate and bulk. The n-type transistor and the p-type transistor share a common source. The active device further includes a first capacitor coupled between the gate of n-type transistor and the gate of p-type transistor; a second capacitor coupled between the drain of the n-type transistor and the drain of p-type transistor; and a third capacitor coupled between the bulk of n-type transistor and the bulk of p-type transistor. The VCO includes a tuning block coupled to the common source to form a common gate amplifier and at least one tuning element coupled to the active device for changing the overall capacitance of the VCO.

7 Claims, 15 Drawing Sheets

Related U.S. Application Data

(60) Provisional application No. 62/100,397, filed on Jan. 6, 2015.

(56) References Cited

U.S. PATENT DOCUMENTS

| | | |
|---|---|---|
| 7,215,201 B2 | 5/2007 | Roine |
| 7,215,206 B2 | 5/2007 | Dupuis |
| 7,369,008 B2 | 5/2008 | Masai |
| 7,764,124 B2 | 7/2010 | Aram |
| 7,834,690 B2 | 11/2010 | Aram |
| 7,834,691 B2 | 11/2010 | Aram |
| 8,049,566 B1 | 11/2011 | Aram |
| 8,058,938 B2 | 11/2011 | Aga et al. |
| 8,081,032 B1 | 12/2011 | Aram |
| 8,143,946 B2 | 3/2012 | Aram |
| 8,150,352 B1 | 4/2012 | Aga et al. |
| 8,378,750 B2 | 2/2013 | Sutardja et al. |
| 8,524,487 B2 * | 9/2013 | Fife .................... G01N 27/4145 257/253 |
| 2003/0067042 A1 | 4/2003 | Kaatz |
| 2006/0284679 A1 | 12/2006 | Roine |
| 2009/0174480 A1 | 7/2009 | Lee |
| 2010/0277250 A1 | 11/2010 | Aga et al. |
| 2010/0329157 A1 | 12/2010 | Xing et al. |
| 2011/0018625 A1 * | 1/2011 | Hodel ................. H01L 27/0629 327/581 |

OTHER PUBLICATIONS

The International Search Report and the Written Opinion of the International Searching Authority for International Application No. PCT/US2016/12370, dated Mar. 28, 2016.

\* cited by examiner

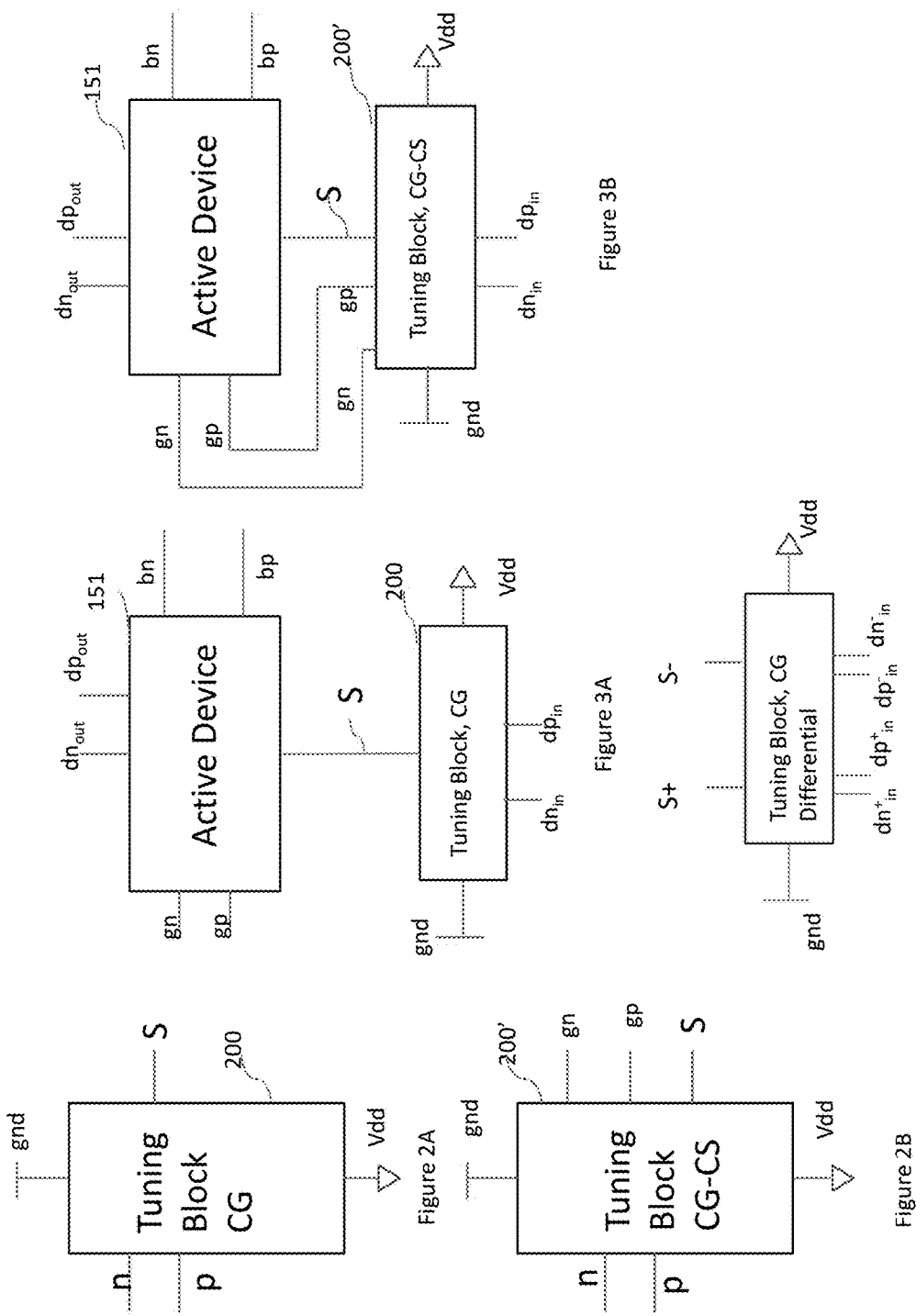

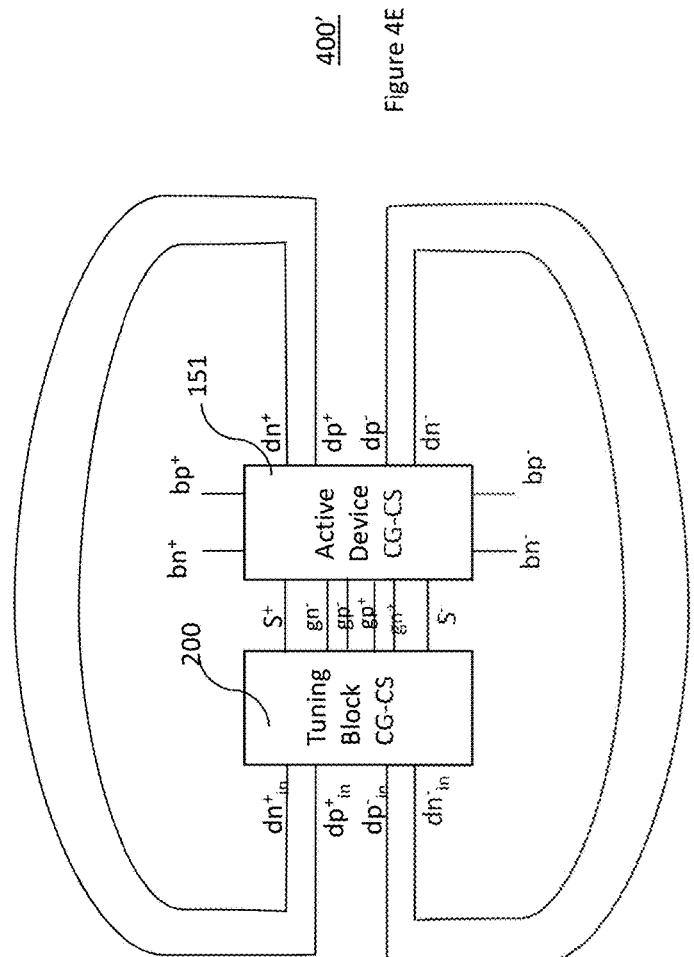
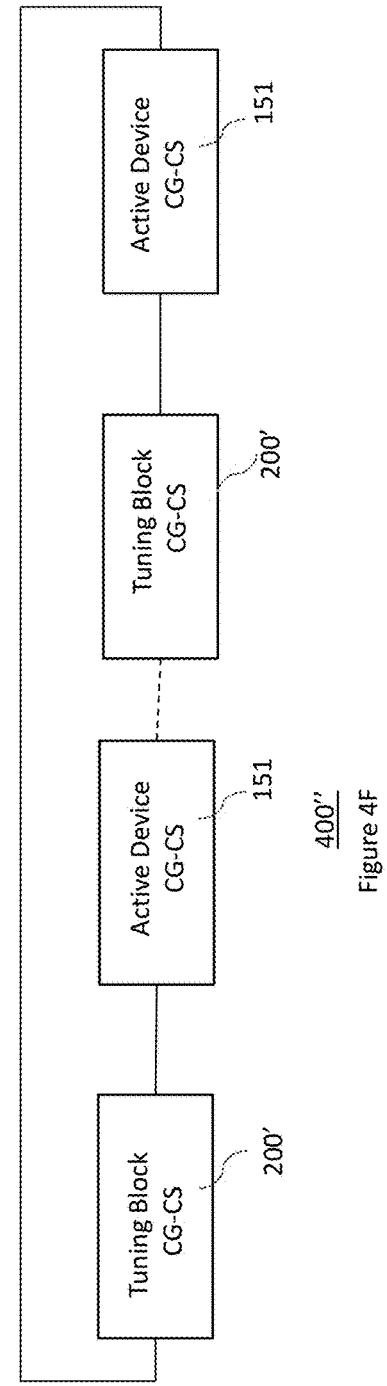

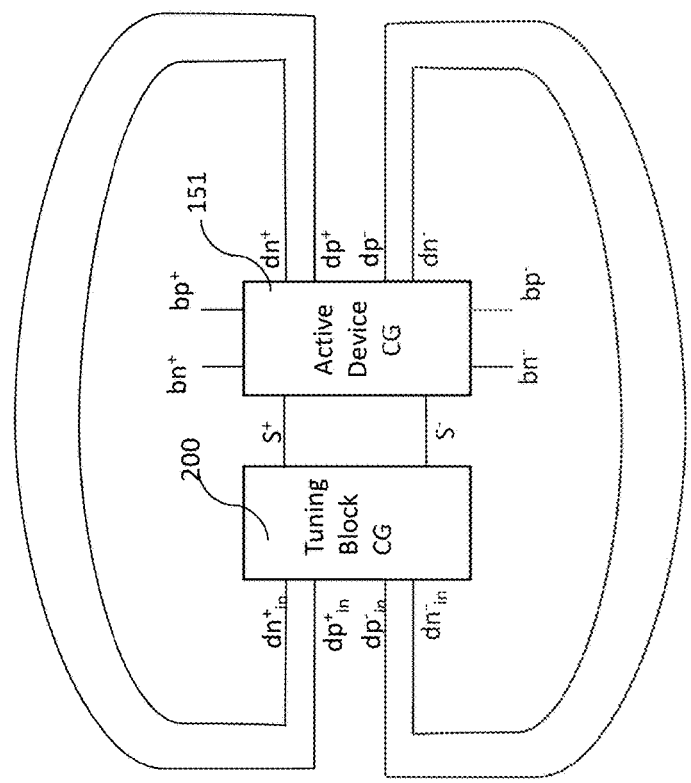
Figure 4G
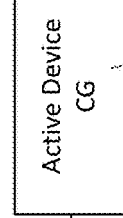
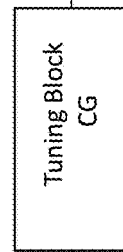
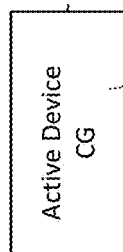
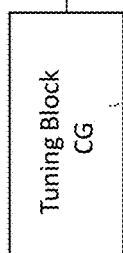
Figure 4H

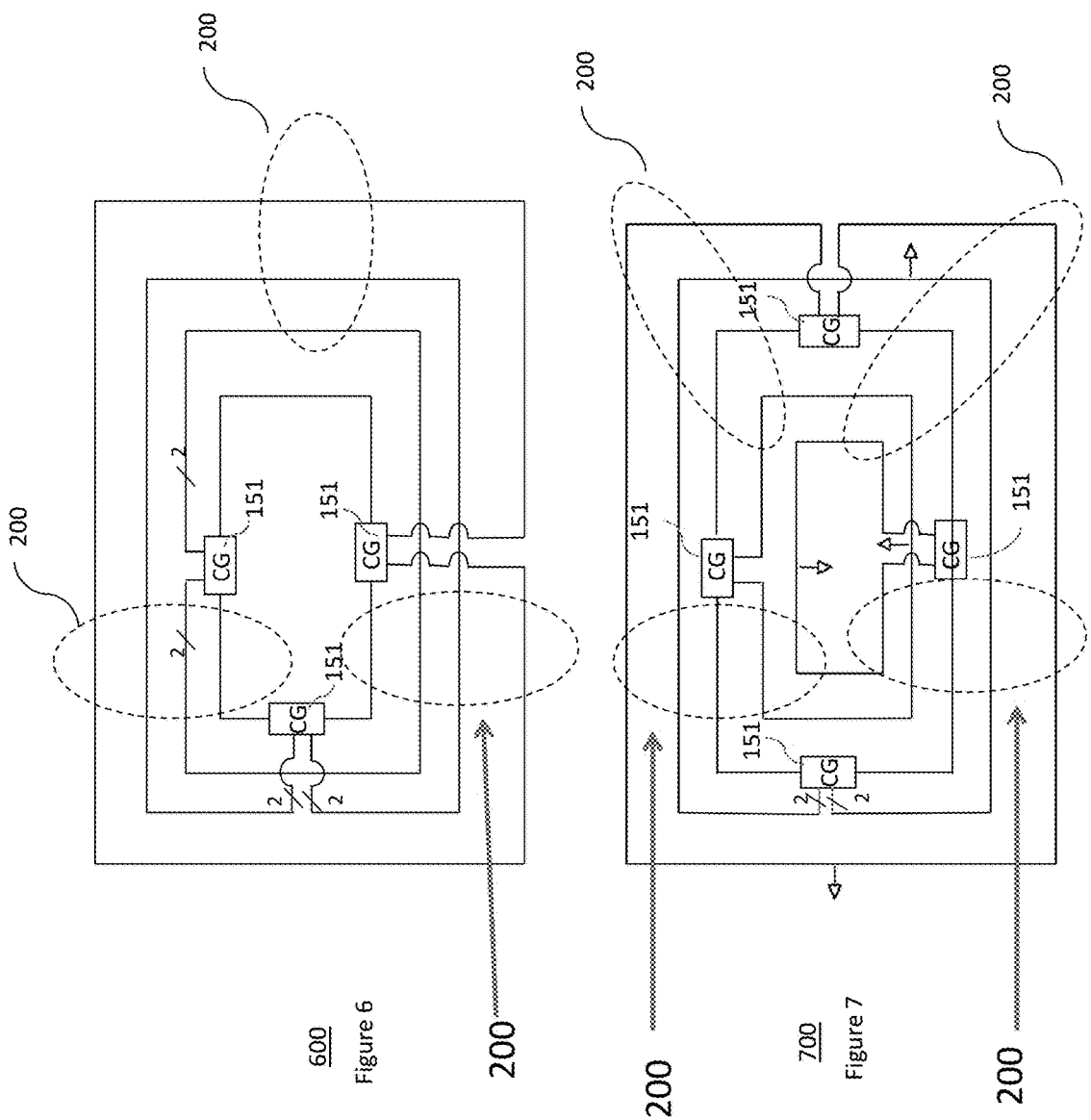

800

900

MEMORYLESS COMMON-MODE INSENSITIVE AND LOW PULLING VCO

CROSS-REFERENCE TO RELATED APPLICATION

This application is a continuation-in-part of U.S. patent application Ser. No. 14/745,261, filed ON Jun. 19, 2015, entitled "ACTIVE DEVICE WHICH HAS A HIGH BREAKDOWN VOLTAGE, IS MEMORY-LESS, TRAPS EVEN HARMONIC SIGNALS AND CIRCUITS USED THEREWITH," and claims benefit under 35 USC 119(e) of U.S. Provisional Patent Application No. 62/100,397, filed on Jan. 6, 2015, entitled "VERY LOW PHASE NOISE, MEMORYLESS COMMON-MODE INSENSITIVE, AND LOW PULLING VCO WITH CAPACITOR BANKS AS TUNING," both of which are incorporated herein by reference in their entirety.

FIELD OF THE INVENTION

The present invention relates generally to wireless devices and more particularly to voltage controlled oscillators utilized in such devices.

BACKGROUND

Wireless products are utilized in a variety of environments such as mobile (for example cellular and Wi-Fi for handsets) or non-mobile (for example Wi-Fi for access points and routers). A voltage-controlled oscillator or VCO is an electronic oscillator whose oscillation frequency is controlled by a voltage input. The applied input voltage determines the instantaneous oscillation frequency. Consequently, modulating signals applied to control input may cause frequency modulation (FM) or phase modulation (PM). A VCO may also be part of a phase-locked loop. The VCO may be utilized in amplifiers in such products to amplify the signals received or transmitted therefrom. As the market for wireless products develops there becomes an ever increasing need for more bandwidth and more data across mobile and non-mobile networks with more demand for higher efficiency and linearity. Therefore the communication of such data over these networks is becoming more and more difficult. For example, as the bandwidth goes up as network evolves, and at the same time the signals consolations become more dense such as 802.11ax standard for WiFi application. As a result, in-band and out of band noise of VCO becomes extremely important. Also VCO pulling is a major issue. This case is more critical in a presence of a high power amplifier for integration. In addition, traditional VCO architectures rely on a buffer to center output of core VCO before driving the inverter chain following the core. This buffer consumes major power and is another source of noise and disturbance issue.

VCO tuning range is another issue. VCO tuning range is limited due to noise of capacitor banks and its parasitics.

Devices and circuits in accordance with the present invention address such a needs.

SUMMARY

A voltage controlled oscillator (VCO) and circuits utilized therewith are disclosed. In a first aspect, the VCO includes an active device. The VCO comprises an active device, wherein the active device further includes an n-type transistor having a drain, gate and bulk; a p-type transistor having a drain, gate and bulk. The n-type transistor and the p-type transistor share a common source.

The active device further includes a first capacitor coupled between the gate of n-type transistor and the gate of p-type transistor; a second capacitor coupled between the drain of the n-type transistor and the drain of p-type transistor; and a third capacitor coupled between the bulk of n-type transistor and the bulk of p-type transistor.

A differential voltage controlled oscillator (VCO) is also disclosed. The differential VCO includes first and second active devices. Each of the first and second active devices further includes an n type transistor having a drain, gate and bulk. Each of the first and second active devices also includes a p-type transistor having a drain, gate and bulk. The n-type transistor and the p-type transistor share a common source. Each of the first and second active devices also includes a first capacitor coupled between the gate of n-type transistor and the gate of p-type transistor. Each of the first and second active devices also includes a second capacitor coupled between the drain of the n-type transistor and the drain of p-type transistor. Each of the first and second active devices further includes a third capacitor coupled between the bulk of n-type transistor and the bulk of p-type transistor. The differential VCO also includes a fourth capacitor coupled between the bulk of the n-type transistor of first active device to shared source of second active device. The differential VCO also includes a fifth capacitor coupled between bulk of p-type transistor of first active device to shard source of second active device. The differential VCO also includes a sixth capacitor coupled between the bulk n-type transistor of second active device to shared source of first active device. The differential VCO also includes a seventh capacitor coupled between the bulk of p-type transistor of second active device to shared source of first active device. The differential VCO also includes a tuning block coupled to the common source to form a common gate amplifier. The differential VCO also includes at least one first tuning device coupled between the drain of the n-type transistor of the first active device and the drain of the n-type transistor of the second active device. The differential VCO also includes at least one second tuning device coupled between the sources of the n-type and p-type transistors of the first active device and the sources of the n-type and p-type transistors of the second active device. Finally, the differential VCO includes at least one third tuning device coupled between the drain of the p-type transistor of the first active device and the drain of the p-type transistor of the second first active device; wherein the differential VCO has a high breakdown voltage, is memory less, very low close in and Ear phase noise, very low sensitivity to supply and ground disturbance and hence low pulling and traps even harmonic signals.

The VCO includes a tuning block coupled to the common source to form a common gate amplifier and at least one tuning element coupled to the active device for changing the overall capacitance of the VCO. The VCO has a high breakdown voltage, is memory less, very low close in and far phase noise, very low sensitivity to supply and ground disturbance and hence low pulling and traps even harmonic signals.

The VCO has a high breakdown voltage since each n-type and p-type device see a portion of total power supply voltage, is memory less since gate capacitance coupled between -type and p-type gates and bulk capacitors couping bulk of n-type and p-type trap common mode signals coupled to critical node of devices and traps even harmonic signals. This combination of n-type and p-type also distinguish between even and odd signals that are generated during class AB or B or C, operation.

A system and method in accordance with the present invention provides an amplifier circuit that can be combined with a transformer to obtain increased gain and positive feedback for voltage controlled oscillator (VCO) applications. The resulting device does not require a buffer or memory since output signal can be taken off each common source which is centered with respect to supply and therefore is smaller in size and uses less power than conventional VCOs.

BRIEF DESCRIPTION OF THE DRAWINGS

FIG. 2A is a first embodiment of a tuning block in accordance with the present invention.

FIG. 2B is a second embodiment of a tuning block in accordance with the present invention.

FIG. 2C is a third embodiment of a tuning block in accordance with present invention FIG. 3A is a block diagram of a common gate amplifier in accordance with the present invention.

FIG. 3B is a block diagram of a combined common gate and common source amplifier in accordance with the present invention.

FIG. 4E is a block diagram of an embodiment of a differential VCO arranged in the form of common-gate, common-source in accordance with the present invention.

FIG. 4F is a block diagram of an embodiment of a cascaded VCO of CG-CS in accordance with the present invention.

FIG. 4G is a block diagram of an embodiment of a differential VCO arranged in the form of common-gate in accordance with the present invention.

FIG. 4H is a block diagram of an embodiment of a cascaded VCO of CG in accordance with the present invention

FIG. 6 is a diagram of three common gate differential active devices coupled to coupled inductive differential tuning blocks in accordance with the present invention.

FIG. 7 is a diagram of four differential common Gate active devices coupled to inductive differential tuning blocks in accordance with the present invention.

DETAILED DESCRIPTION

The present invention relates generally to wireless devices and more particularly to a voltage controlled oscillators utilized in such devices. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 1B:
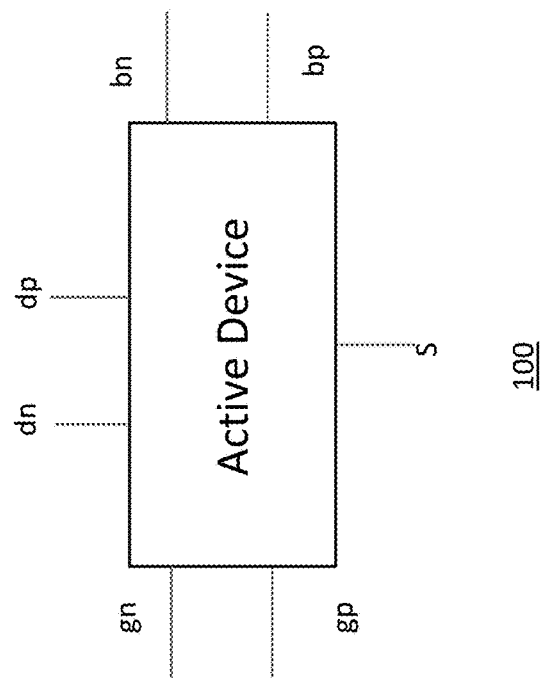
FIG. 1B is a block diagram of the active device shown in FIG. 1A.
Figure 1A:
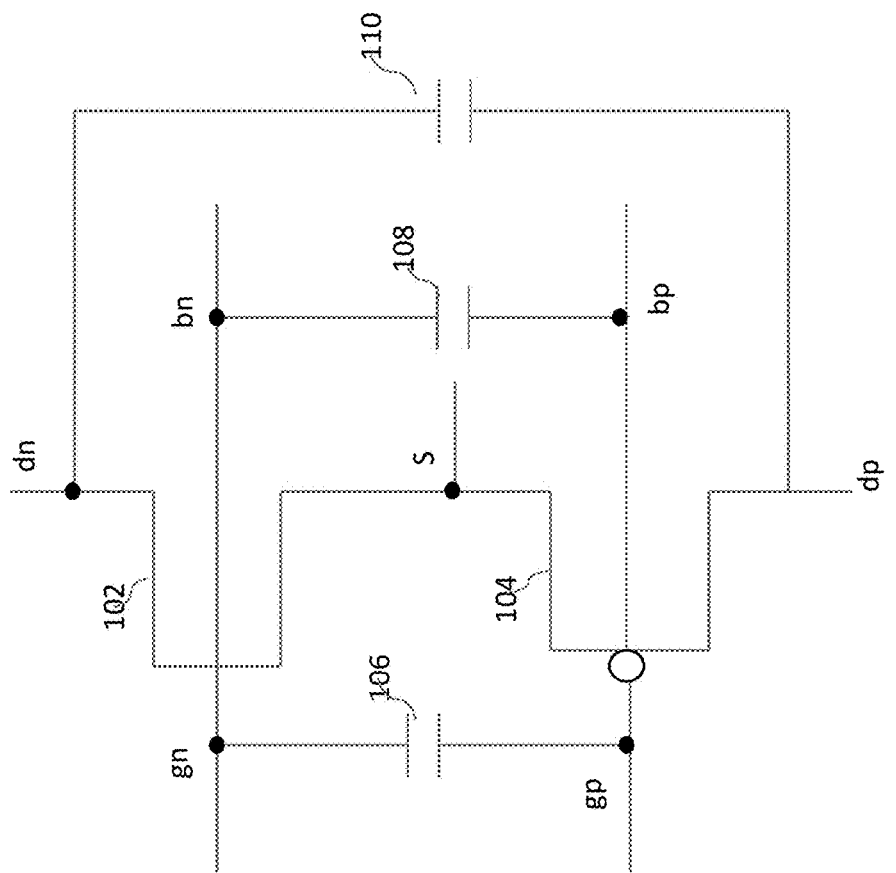
FIG. 1A is a schematic diagram of an active device utilized within a voltage controlled oscillator in accordance with the present invention.

FIG. 1A is a schematic diagram of an active device 100 utilized within a voltage controlled oscillator in accordance with the present invention. The active device and its use within an amplifier circuit has been described in detail in a copending U.S. application, owned by the assignee of the present application, entitled, ACTIVE DEVICE WHICH HAS A HIGH BREAKDOWN VOLTAGE, IS MEMORYLESS, TRAPS EVEN HARMONIC SIGNALS AND CIRCUITS USED THEREWITH, filed Jun. 19, 2015. The active device 100 includes a n-type transistor 102 which includes a gate (gn), drain (dn) and bulk (bn) and a p-type transistor 104 which includes a gate (gp), drain (dp) and bulk (bp). The n-type transistor 102 and the p-type transistor 104 share a common source (s). The active device 100 includes a first capacitor 106 coupled between gn and gp, a second capacitor 108 coupled between dn and dp; and a third capacitor 110 coupled between bn and bp. The active device 100 has a high breakdown voltage due to the four terminals (gate, drain bulk and source), is memory-less and traps even harmonic signals when utilized with certain amplifiers such as Class AB amplifiers.

FIG. 1B is a block diagram of the active device 100 shown in FIG. 1A. The n-type transistor 102 can be NPN bipolar or any other active element from GaAs. The p-type transistor 104 can be PNP bipolar or any other active complementary from GaAs. The n-type transistor 102, can further be protected by a cascode NMOS circuit. The p-type transistor 104 can farther be protected by a cascode PMOS circuit. Capacitor 106 can be a variable capacitor, it can have a series resistor and or series inductor all being variable. Capacitor 106 can further be split into N number of capacitors with any series elements. Capacitor 108 can be a variable capacitor, it can have a series resistor and or series inductor all being variable. Capacitor 108 can further be split into N number of capacitors with any series elements. Capacitor 110 can be a variable capacitor, it can have a series resistor and or series inductor all being variable. Capacitor 110 can further be split into N number of capacitors with any series elements.

More capacitors can be coupled (parasitic or non-parasitic) from dn to gn, dn to gp, dp to gp, dp to gn. These capacitors can be variable and or have series passive or active elements such as inductor, resistor, transformers and so on. Node gp can connect to a bias network. This bias network can include any passive, such as resistor, capacitor, inductor, transformer and any combinations of them. The bias can also include any active elements.

In the case of using cascode transistor for both n-type and p-type or either one, additional capacitors may be needed to connect drain of cascode n-type to drain of cascode p-type similar to capacitor 110. Also a capacitor coupling a bulk of cascade n-type to a bulk of cascade p-type may be similar to capacitor 108. In addition, a capacitor can be connected from gate of cascode n-type to the gate of cascade p-type similar to capacitor 106.

Figure 1C:
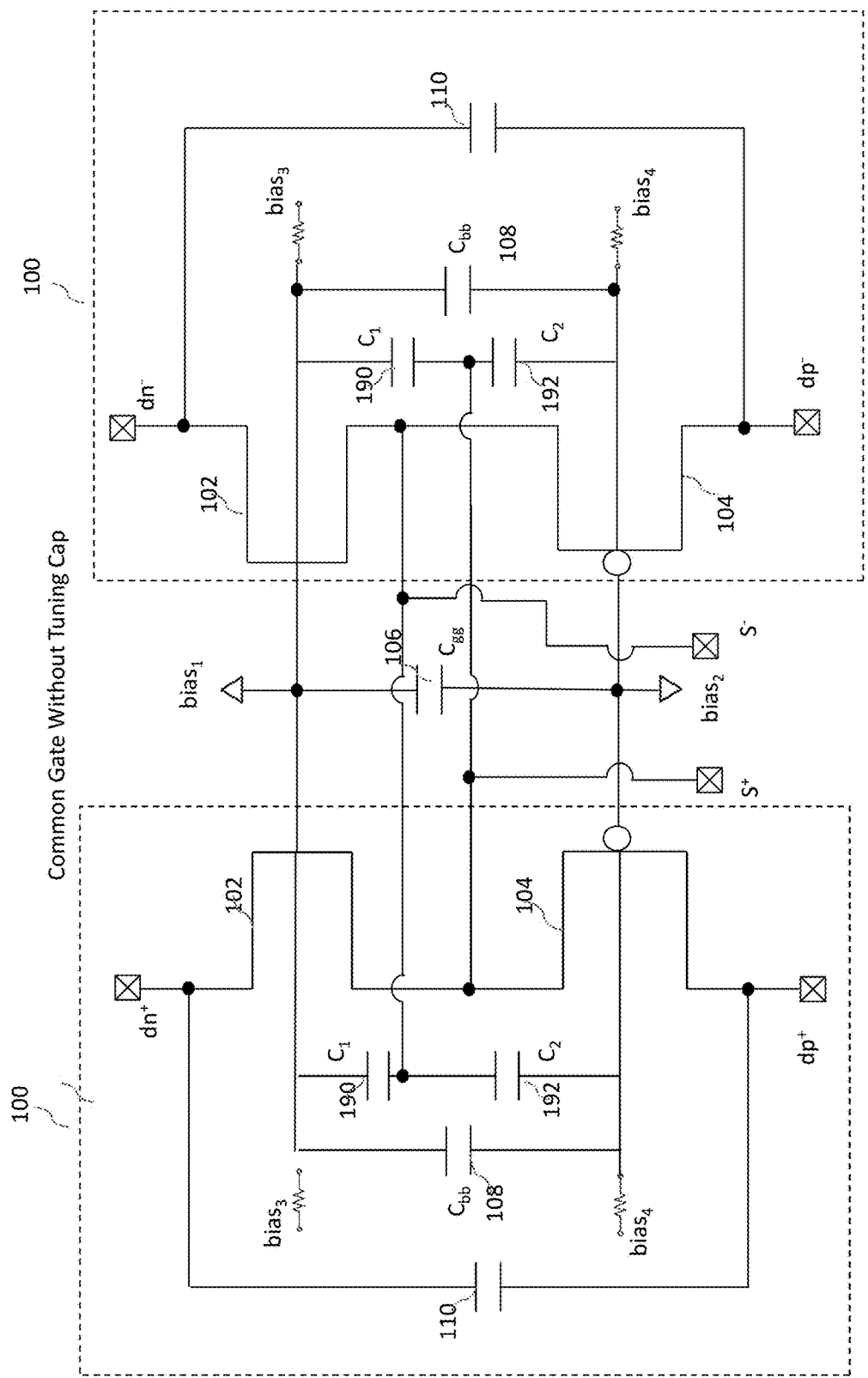
FIG. 1C is a schematic diagram of a differential active device utilized within a voltage controlled oscillator in accordance with the present invention.

FIG. 1C is a schematic diagram of a differential active device 150 utilized within a voltage controlled oscillator in accordance with the present invention. The differential active device 150 includes first and second active devices 100 coupled in a differential manner. The differential active device includes capacitors 190 and 192 in both active devices 100 that are coupled from bulk to source of the respective transistors 102 and 104. The capacitors 190 and 192 improve the linearity, stability, and self gain at high frequency of the common gate active device 150. Capacitor 106 which connects common gates of n-type devices to common gates of p-type devices can trap any common mode signals from supply, ground and self generated even harmonics (by VCO or amplifier entering class AB, B, C, ... modes) such that to improve issues related to VCO pulling and memory effects.

Capacitors 108 that connect bulk of n-type to bulk of p-type devices provide a path for any even harmonics generated by the class AB, B, C, ... action of VCO or amplifier. Also providing filtering from supply or ground noise to any bulk node, improving VCO pulling or issues related to memory effects.

Figure 1D:
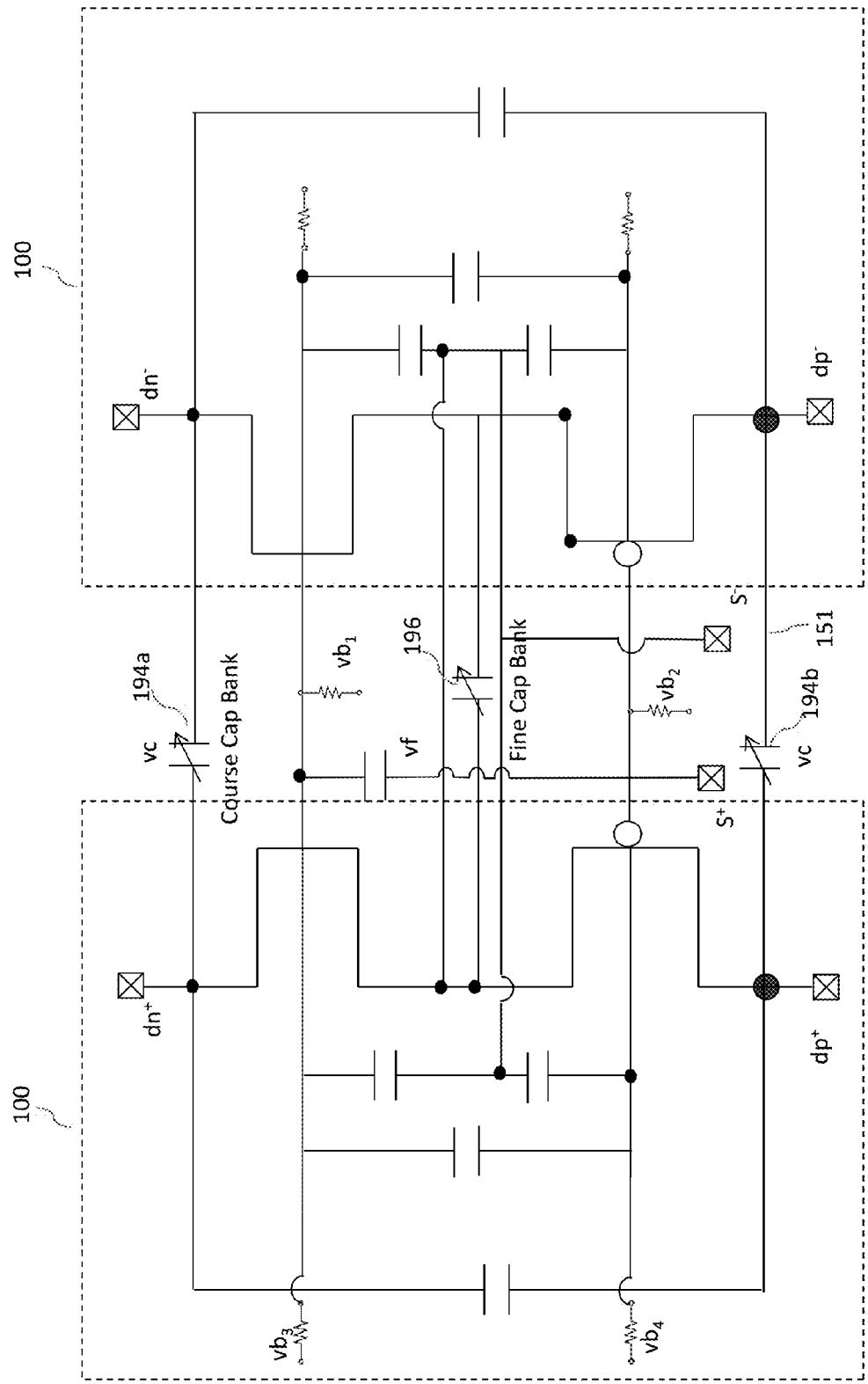
FIG. 1D is a schematic diagram of a differential active device that includes capacitive tuning elements utilized within a voltage controlled oscillator in accordance with the present invention.

FIG. 1D is a schematic diagram of a differential active device 151 that includes capacitive tuning elements 194a, 194b and 196 utilized within a voltage controlled oscillator in accordance with the present invention. The differential active device 151 includes similar to that of FIG. 1C. Tuning elements 194a and 194b are coupled between the drains of the active devices 100 to provide a coarse tuning adjustment of the device 151. Tuning element 196 is coupled between the sources of the active devices 100 to provide a fine tuning adjustment of the device 151. The tuning elements 194a, 194b and 196 are utilized to vary the effective capacitance (including any parasitic capacitance that are not shown but obvious otherwise) of the device 151. This in turn can change the center frequency of overall VCO structure. Tuning element 194a can be a variable capacitor, it can have a series resistor and or series inductor all being variable. Tuning element 194a can further be split into N number of capacitors with any series elements. Tuning element 194b can be a variable capacitor, it can have a series resistor and or series inductor all being variable. Tuning element 194b can further be split into N number of capacitors with any series elements. Capacitor 110 can be a variable capacitor, it can have a series resistor and or series inductor all being variable. Capacitor 110 can further be split into N number of capacitors with any series elements.

Figure 1E:
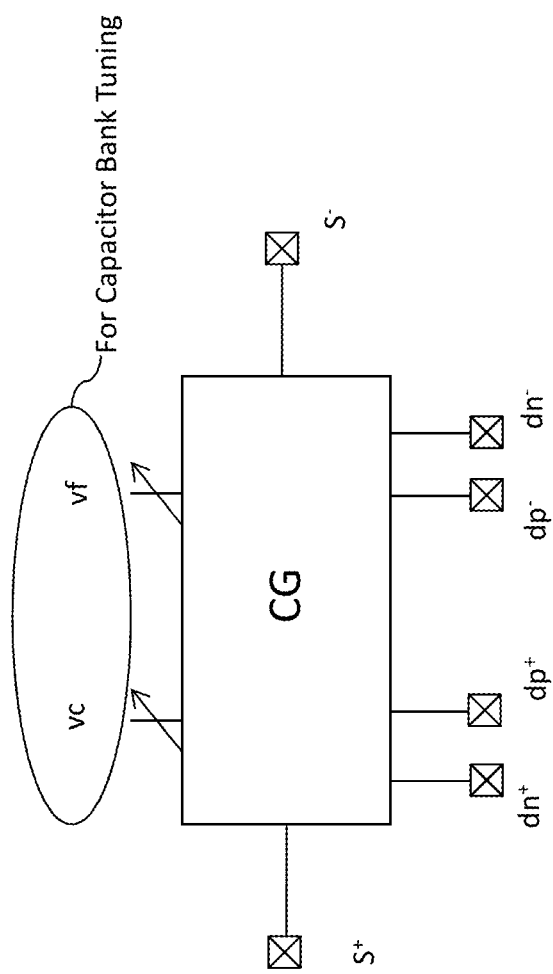
FIG. 1E is a block diagram of the differential active device shown in FIG. 1D.

FIG. 1E is a block diagram of the differential active device shown in FIG. 1D. Similar to FIG. 1A, in each of the active devices, the n-type transistor 102 can be NPN bipolar or any other active element from GaAs. The p-type transistor 104 can be PNP bipolar or any other active complementary from GaAs. The n-type transistor 102, can further be protected by a cascode NMOS or NPN circuit. The p-type transistor 104 can farther be protected by a cascode PMOS or PNP circuit. Capacitor 106 can be a variable capacitor, it can have a series resistor and or series inductor all being variable. Capacitor 106 can further be split into N number of capacitors with any series elements. Capacitor 108 can be a variable capacitor, it can have a series resistor and or series inductor all being variable. Capacitor 108 can further be split into N number of capacitors with any series elements. Capacitor 110 can be a variable capacitor, it can have a series resistor and or series inductor all being variable. Capacitor 110 can further be split into N number of capacitors with any series elements.

More capacitors can be coupled (parasitic or non-parasitic) from dn to gn, dn to gp, dp to gp, dp to gn. These capacitors can be variable and or have series passive or active elements such as inductor, resistor, transformers and so on. Node gp can connect to a bias network. This bias network can include any passive, such as resistor, capacitor, inductor, transformer and any combinations of them. The bias can also include any active elements.

In the case of using cascode transistor for both n-type and p-type or either one, additional capacitors may be needed to connect drain of cascode n-type to drain of cascode p-type similar to capacitor 110. Also a capacitor coupling a bulk of cascade n-type to a bulk of cascade p-type may be similar to capacitor 108. In addition, a capacitor can be connected from gate of cascode n-type to the gate of cascade p-type similar to capacitor 106.

If active device 100 in FIG. 1A or differential active devices 150 or 151 of FIG. 1C and FIG. 1D respectively is driven in class AB or B or C or D or any other class except class A, then the active device 151 generates even and odd harmonic output currents flowing through dn and dp nodes. Active device 151 can distinguish between even and odd harmonics by generating similar direction current flow at nodes dn and dp in case of odd harmonics such as main signal or $3^{rd}$ harmonic. However active device 100 will generate opposing direction currents at node dn and dp for even harmonic such as $2^{nd}$, $4^{th}$, $6^{th}$ and so on. Also a filtering action caused by capacitors 110, 108 and 106 will effect magnitude of even harmonics flowing through dn and dp nodes.

FIG. 2A is a first embodiment of a tuning block 200 in accordance with the present invention. The single ended tuning block 200 includes two inputs dn and dp, one output, s and a voltage supply, (vdd) and ground, (gnd). Input signals in the form of current can be provided to nodes dn and dp, as I_in_n and I_in_p respectively. The tuning block 200 which can include a combination of all or few part of passive, inductors, capacitors, resistors and transformers but not limited to any has a function of receiving I_in_n and I_in_p and providing an output current, I_s at node S with following condition: I_s>I_in_n+I_in_p. The tuning block 200 is utilized to provide a linear output signal regardless of the power. A combination of tuning block 200 and the active device 100, form a common gate amplifier.

FIG. 3A is a block diagram of a single ended common gate amplifier in accordance with the present invention. The common gate amplifier comprises the active device 100 coupled to the tuning block 200. In this embodiment, current I_s from the tuning block 200 is provided to the source connection, S of the active device 100. Due to a common gate action of device 100, the current I_s will split and a portion of it is directed to dn as output current I_out_n and the other portion directed to dp as output current I_out_p. The gates gn and gp of the active device 100 are coupled to bias lines. (No signal is applied to gn and gp). Bulk nodes, bn and bp are also coupled to their respective bias lines.

In the case when the active device 100 is operating under class AB, B, C, D and F mode, other even and odd harmonics current generate internal to the active device 100. These currents are directed toward dn and dp. For even harmonics such as AM (Amplitude modulated) currents and $2^{nd}$ harmonics the direction of current flow through dn and dp are opposite. However for odd harmonics, such as main signal current and $3^{rd}$ harmonics, direction of output currents through dn and dp are the same.

FIG. 2B is a second embodiment of a tuning block 200' in accordance with the present invention. The single ended tuning block 200' includes of two inputs dn and dp, three outputs, s, gn and gp. The single ended tuning block 200' has a supply (vdd), and ground (gnd). Input signal in the form of current is inserted to nodes dn and dp with I_in_n and I_in_p respectively. Tuning block 200' which can includes a combination of all or few part of passive, inductors, capacitors, resistors and transformers but not limited to any has a function of receiving I_in_n and I_in_p and then provide an output current, I_s at node S with following condition: I_s>I_in_n+I_in_p. the output gp and gn are voltages which will drive gn and gp nodes of the active device 100. As shown in FIG. 3B, combining tuning block 200' with active device 100, form a common-gate/common source amplifier action.

In addition, tuning block 200' may only send gate information gn and gp and no information at S node. In this case, S node can be grounded or coupled to any passive device such as resistor, capacitor, inductor, transformer or active device or all. Combination of tuning block 200' and active device 100, in this particular case form a common-source amplifier.

FIG. 3B is a block diagram of a combined common gate and common source amplifier in single ended form in accordance with the present invention. The common gate and common source amplifier comprises the active device 100 coupled to the tuning block 200'. In this embodiment, current I_s from the tuning block 200' is provided to the source connection, S of the active device 100. Due to common gate action of device for any current entering node s, the current I_s will split and portion of it directed to dn as output current I_out_n and the other portion directed to dp as output current I_out_p. The gates gn and gp of the active device 100 are coupled to bias lines as well as driven by output nodes of tuning block gn and gp. Bulk nodes, bn and bp are also coupled to their respective bias lines. Nodes gn and gp can further be connected to their respective bias which is isolated from main signal.

Figure 4A:
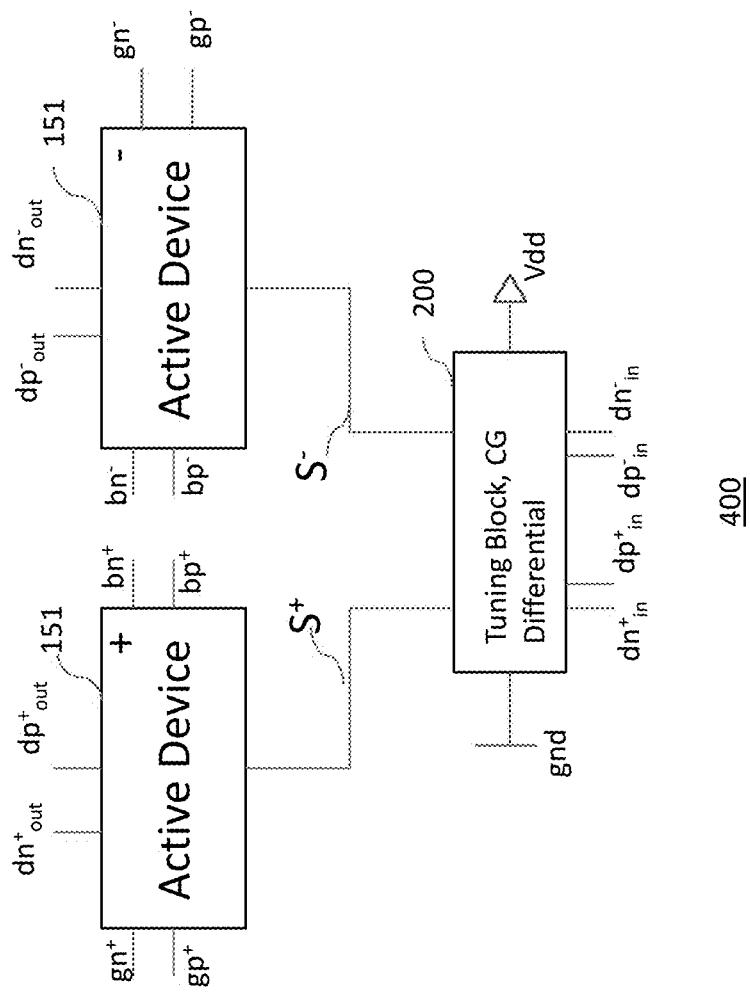
FIG. 4A is a block diagram of a first embodiment of a differential common gate amplifier in accordance with the present invention.

FIG. 4A is a block diagram of a first embodiment of a differential common gate amplifier 400 in accordance with the present invention. The amplifier 400 comprises a differential tuning block 200 coupled to a first and second active device 151. The differential tuning block 200 comprises four inputs dn_in+, dp_in+ and dn_in−, dp_in−, and two output,s s+ and s−. A supply (vdd) and a ground (gnd) is provided. Input signals in the form of current are inserted to nodes dn_in+, dp_in+ and dn_in−, dp_in− as I_in_n+, I_in_p− and I_in_n− and I_in_p− respectively. Tuning block 200 which can include a combination of all or few part of passive, inductors, capacitors, resistors and transformers but not limited to any has a function of receiving I_in_n+, I_in_p+ and I_in_n−, I_in_p− and process them as output currents I_s+ and I_s− at node S+ and S− respectively with following condition: I_s+>(I_in_n+)+(I_in_p+) and I_s−>(I_in_n−)+(I_in_p−)

In this embodiment, current I_s from the tuning block 200 is provided to the source connection, S of the active device+ 151. Due to a common gate action of device 151+, the current I_s will split and a portion of it is directed to dn as output current I_out_n and the other portion directed to dp as output current I_out_p. The gates gn and gp of Active device are coupled to bias lines. (No signal is applied to gn and gp). Bulk nodes, bn and bp are also coupled to their respective bias lines.

Similarly, in this embodiment, current I_s from the tuning block 200 is provided to the source connection, S of the active device 151−. Due to a common gate action of device 15−, the current I_s will split and a portion of it is directed to dn as output current I_out_n and the other portion directed to dp as output current I_out_p. The gates gn and gp of Active device are coupled to bias lines. (No signal is applied to gn and gp). Bulk nodes, bn and bp are also coupled to their respective bias lines.

Any number of capacitors or variable capacitors can be coupled between + and − nodes of inputs and of tuning block 200. As well any number of capacitors or variable capacitors can connect between + and − nodes of input, outputs, gates, bulks to input and outputs of active device+ 151 and active device− 151. For example, cross capacitors or variable capacitors can be coupled between dn+ and dn−; dp+ and dp−; dn− and dp+; dn+ and dp− and or any combination thereof. Also these capacitors or variable capacitors can include series resistors or series inductance or parallel resistors or parallel inductors which do not affect or alter the invention.

Figure 4B:
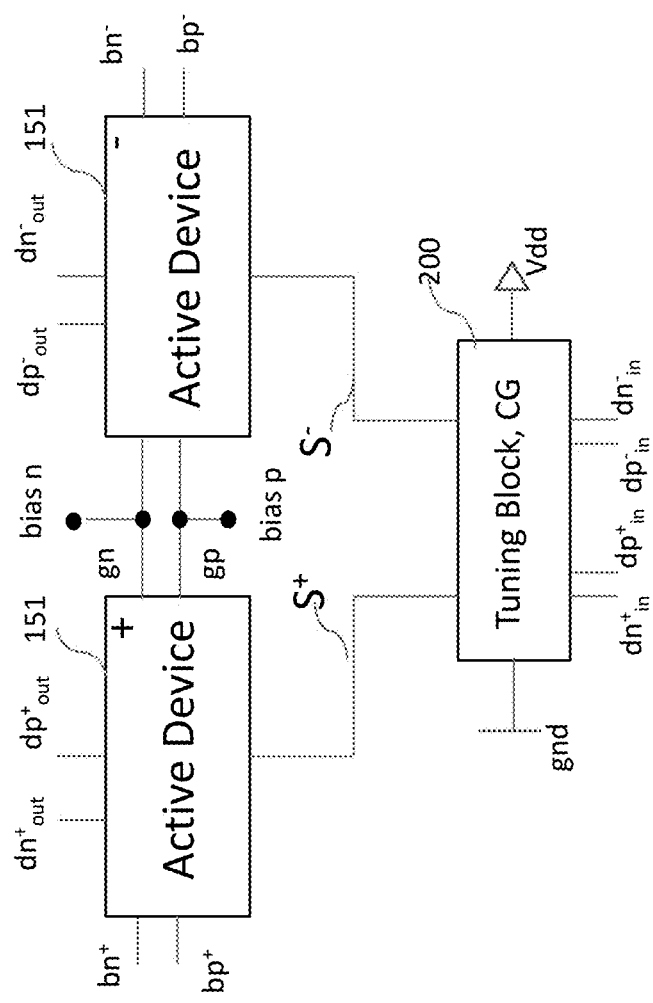
FIG. 4B is a block diagram of a second embodiment of a differential common gate amplifier in accordance with the present invention.

FIG. 4B is a block diagram of a second embodiment of a differential common gate amplifier in accordance with the present invention. The amplifier 400 comprises a differential tuning block 200 coupled to a first and second active device 151. The differential tuning block 200 comprises four inputs dn_in+, dp_in+ and dn_in−, dp_in−, and two output,s s+ and s−. A supply (vdd) and a ground (gnd) is provided. Input signals in the form of current are inserted to nodes dn_in+, dp_in+ and dn_in−, dp_in− as I_in_n+, I_in_p− and I_in_n− and I_in_p− respectively. A supply vdd in the left and gnd to the right. Tuning block 200 which can include a combination of all or few part of passive, inductors, capacitors, resistors and transformers but not limited to any has a function of receiving I_in_n+, I_in_p+ and I_in_n− , I_in_p− and process them as output currents I_s+ and I_s− at node S+ and S− respectiely with following condition: I_s+>(I_in_n+)+(I_in_p+) and I_s−>(I_in_n−)+(I_in_p−).

In this embodiment, current I_s from the tuning block 200 is provided to the source connection, S of the active device+ 151. Due to a common gate action of device 151+, the current I_s will split and a portion of it is directed to dn as output current I_out_n and the other portion directed to dp as output current I_out_p. The gates gn and gp of Active device are coupled to bias lines forming a virtual ground between + and − side (No signal differential signal is applied to gn and gp). Bulk nodes, bn and bp are also coupled to their respective bias lines.

Similarly, in this embodiment, current I_s from the tuning block 200 is provided to the source connection, S of the active device 151−. Due to a common gate action of device 151−, the current I_s will split and a portion of it is directed to dn as output current I_out_n and the other portion directed to dp as output current I_out_p The gate gn− is coupled to gate gn+ to form a virtual ground and they share a common bias voltage, vbias_n. Similarly, gp− and gp+ are coupled together to form a virtual ground and they share a common bias voltage, bias_p. Bulk nodes, bn− and bp− are also coupled to their respective bias lines.

Any number of capacitors or variable capacitors can be coupled between + and − nodes of inputs and outputs of tuning blocks 200. As well any number of capacitors or variable capacitors can connect between + and − nodes of input and outputs, gates, bulks and sources of active device+ 151 and active device− 151. For example, cross capacitors or variable capacitors can be coupled between dn+ and dn−; dp+ and dp−; dn− and dp+; dn+ and dp− or any combination thereof. Also these capacitors or variable capacitors can include series resistors or series inductance or parallel resistors or parallel inductors which do not affect or alter the invention.

Figure 4C:
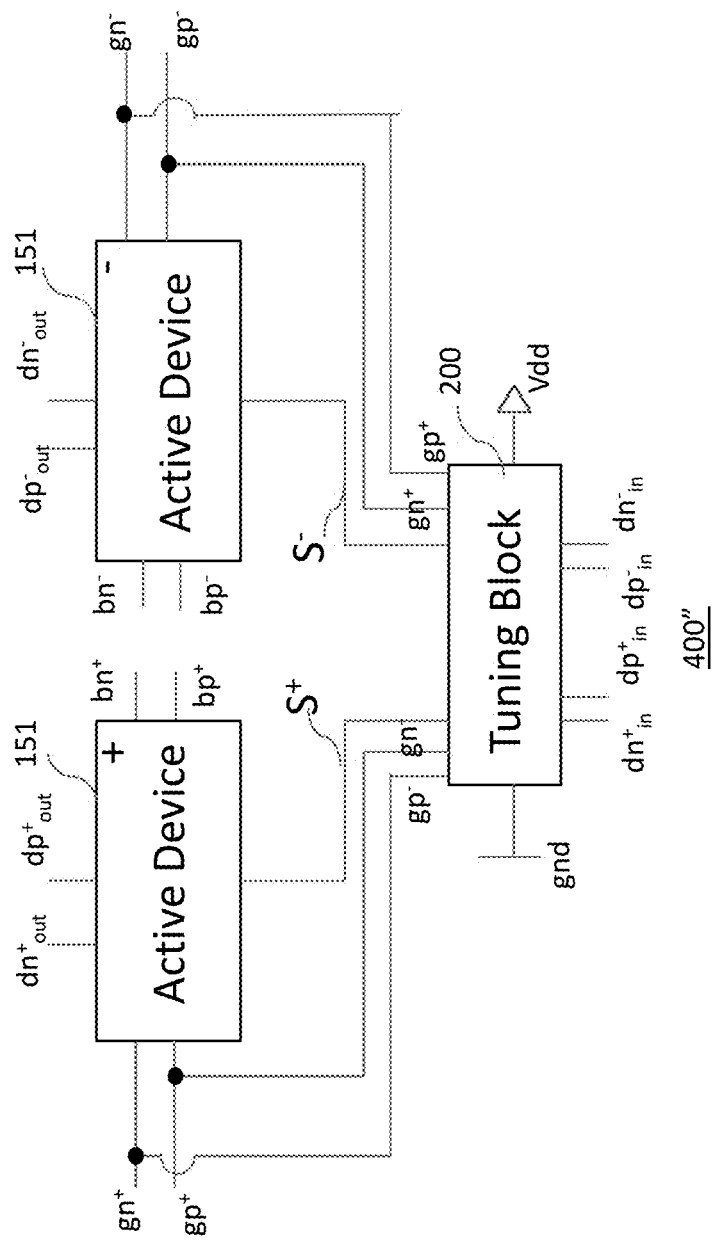
FIG. 4C is a block diagram of an embodiment of a differential combined common gate and common source amplifier in accordance with the present invention.

FIG. 4C is a block diagram of an embodiment of a differential combined common gate and common source amplifier in accordance with the present invention. The amplifier 400 comprises a differential tuning block 200 coupled to a first and second active device 151. The differential tuning block 200 comprises four inputs n+, p+ and n−, d− and 6 outputs s+, s−, gn+, gn−, gp+, gp−. Also a supply vdd and gnd is provided for needed biasing of any active device that is feeding nodes dn+, dn−, dp+ and dp−.

Input signals are in the form of current and are provided to nodes n+, p+ and n−, p− as I_in_n+, I_in_p+ and I_in_n− and I_in_p− respectively. Tuning block 200 which can include a combination of all or some of passive devices s such as inductors, capacitors, resistors and transformers but not limited to any has a function of receiving I_in_n+, I_in_p+ and I_in_n−, I_in_p− and process them as output currents I_s+ and I_s− at node S+ and S− respectively with following condition: I_s+>(I_in_n+)+(I_in_p+) and I_s−> (I_in_n−)+(I_in_p−).

The other four output nodes of the tuning block 200 connect to positive and negative n-type and p-type gates of active device+ 151 and active device− 151 respectively to form a differential common gate-common source amplifier.

Current I_s+ is provided to active device+ 151 source connection, S. Due to common gate action of this device, the current I_s+ will split and portion of it is directed to dn+ as output current I_out_n+ and the other portion directed to dp+ as output current I_out_p+. The gates gn+ and gp+ of active device+ 151 are coupled to bias lines. (No signal is applied to gn+ and gp+). Bulk nodes, bn+ and bp+ are also coupled to their respective bias lines.

Similarly, current I_s− is entering active device− 151 source connection, S. Due to a common gate action of active device− 151, the current I_s− will split and portion of it is directed to dn− as output current I_out_n− and the other portion directed to dp− as output current I_out_p−.

Any number of capacitors or variable capacitors can connect between + and − nodes of inputs and outputs, gates and bulks and sources of tuning block 200. As well any number of capacitors or variable capacitors can connect between + and − nodes of input and outputs of active device+ 151 and active device− 151. For example, cross capacitors or variable capacitors can connect between dn+ and dn−; dp+ and dp−; dn− and dp+; dn+ and dp− and any combination thereof. Also these capacitors or variable capacitors can include series resistors or series inductance or parallel resistors or parallel inductors, which do not affect or alter the invention.

Figure 4D:
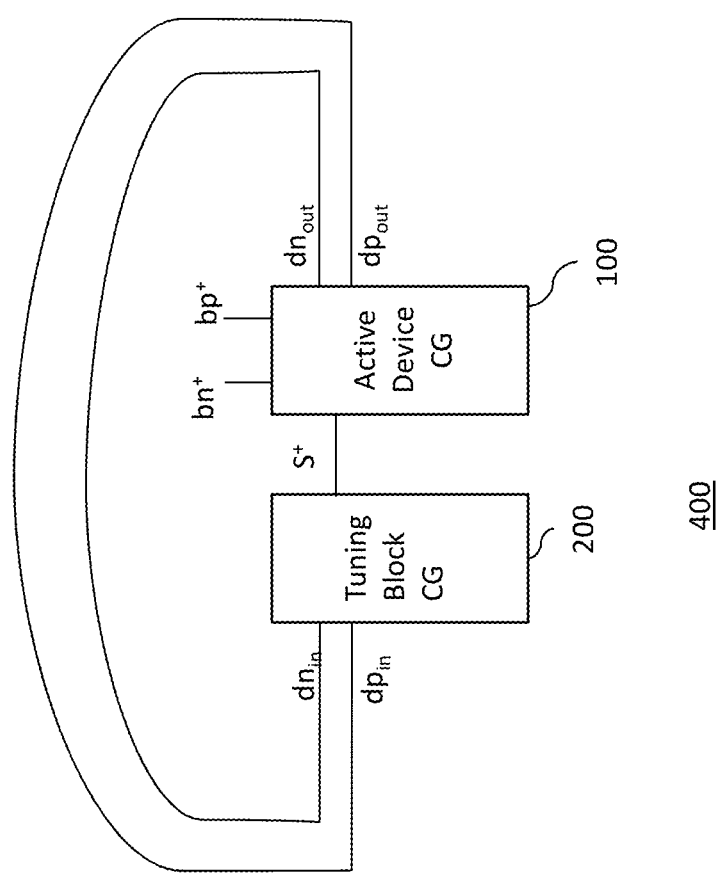
FIG. 4D is a block diagram of an embodiment of a single ended voltage controlled oscillator (VCO) in accordance with the present invention.

FIG. 4D is a block diagram of an embodiment of a single ended voltage controlled oscillator (VCO) 400 in accordance with the present invention. As is shown the active device 100 is coupled to the tuning block 200 directly via the source and in a feedback relationship via the drains.

FIG. 4E is a block diagram of an embodiment of a differential VCO 400' in accordance with the present invention. As is shown, the active device 151 is coupled to the tuning block 200 directly via the sources and gates and in a feedback relationship via the drains.

FIG. 4F is a block diagram of an embodiment of a cascaded VCO 400" in accordance with the present invention. FIG. 4F shows cascade of common source tuning and active devices. However a mix and match of common gate or common gate, common source or even common source can be implemented that is in accordance with the present invention.

FIG. 4G is a block diagram of an embodiment of a differential VCO 410 in accordance with the present invention. As is shown, the active device 151 is coupled to the tuning block 200 directly via the sources and in a feedback relationship via the drains. Effective loop feedback has a positive sign to ensure oscillation.

FIG. 4H is a block diagram of an embodiment of a cascaded VCO 410' in accordance with the present invention. FIG. 4H shows cascade of common gate tuning and active devices. However a mix and match of common gate or common gate, common source or even common source can be implemented that is in accordance with the present invention. The dotted lines means many of these blocks could be present.

Figure 4I:
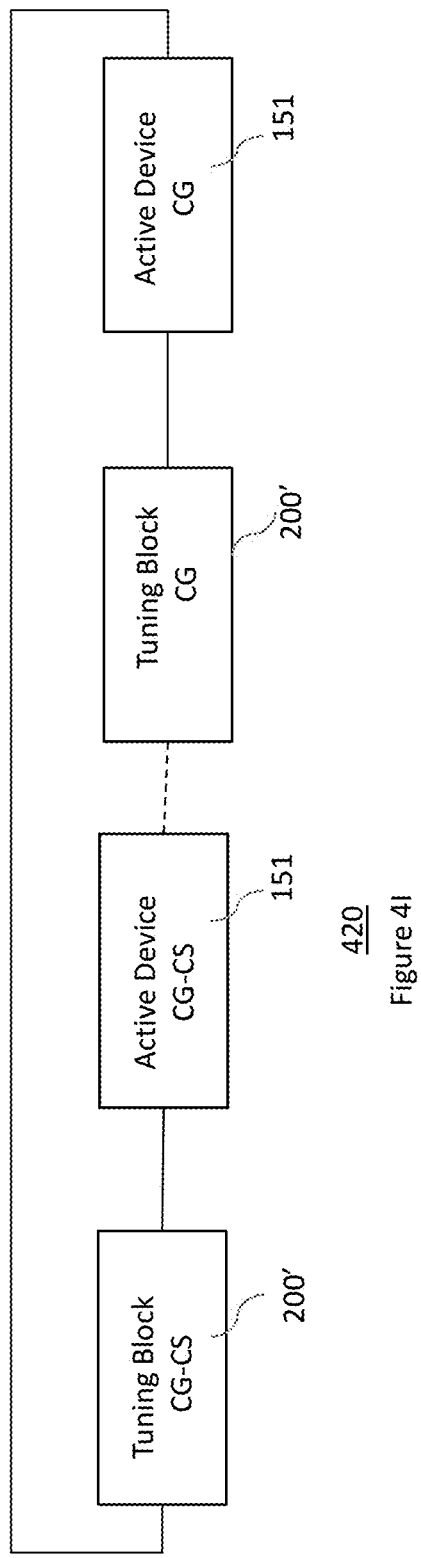
FIG. 4I is a block diagram of an embodiment of a cascaded VCO of CG and CG-CS combination

FIG. 4I is a block diagram of an embodiment of a cascaded VCO 420 in accordance with the present invention. FIG. 4i shows cascade of common gate tuning and active devices with common gate tuning and active devices. The dotted line means there could be many combinations of common gate active and tuning devices or common gate, common source active and tuning devices.

Figure 5:
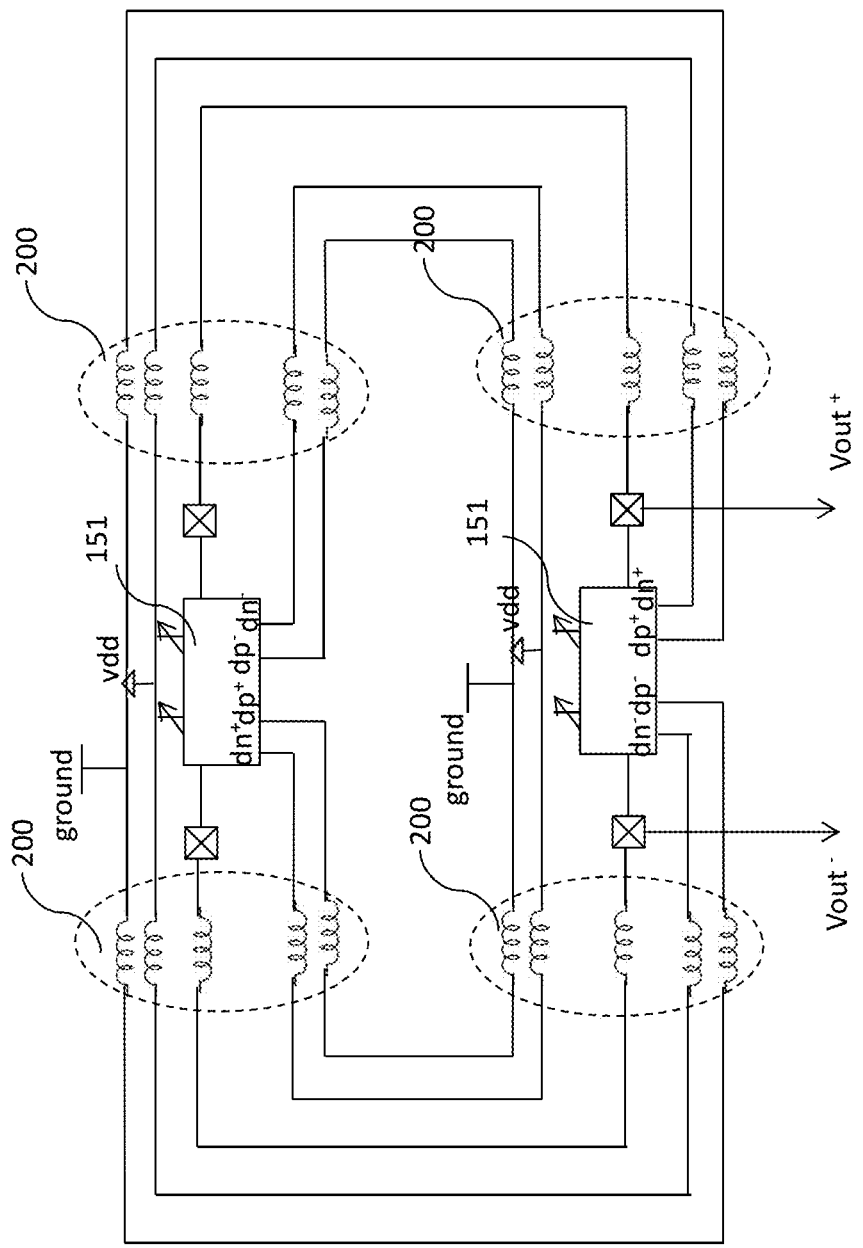
FIG. 5 is a diagram of a two differential common gate active devices coupled to coupled inductive differential tuning blocks in accordance with the present invention.

FIG. 5 is a diagram of a two differential active devices coupled to inductive tuning blocks to form a VCO 500 in accordance with the present invention. FIG. 5 illustrates how to achieve positive feedback loop with gain greater than one and approaching gain of two using passive inductance in combination with common gate amplifier. Clusters of inductors, 200 are coupled to each other. This satisfies condition that source current is more than each drain current as specified with tuning block functionality. Although not shown if FIG. 5, same polarity sources can connect together as well as same polarity dn or dp can connect to each other without altering functionality. For example S+ of each active device, 151 can connect together. Or S− of each active device can connect together.

FIG. 6 is a diagram of three differential active devices coupled to inductive tuning blocks to form a VCO 600 in accordance with the present invention. FIG. 6 illustrates how to achieve positive feedback loop with gain greater than one and approaching gain of three using passive inductance in combination with common gate amplifier. Clusters of inductors, 200 are coupled to each other. This satisfies condition that source current is more than each drain current as specified with tuning block functionality. Although not shown if FIG. 6, same polarity sources can connect together as well as same polarity dn or dp can connect to each other without altering functionality. For example S+ of each active device, 151 can connect together. Or S− of each active device can connect together.

FIG. 7 is a diagram of four differential active devices coupled to inductive tuning blocks in accordance with the present invention. FIG. 7 illustrates that the gain can be more than one and approaching gain of four by this positive feedback. All inductors grouped within dotted ovals are coupled to each other. Same polarity source nodes of each active device can be connected together without altering the invention. Also same polarity dn and dp nodes of each active device can be connected together without altering the invention.

Figure 8:
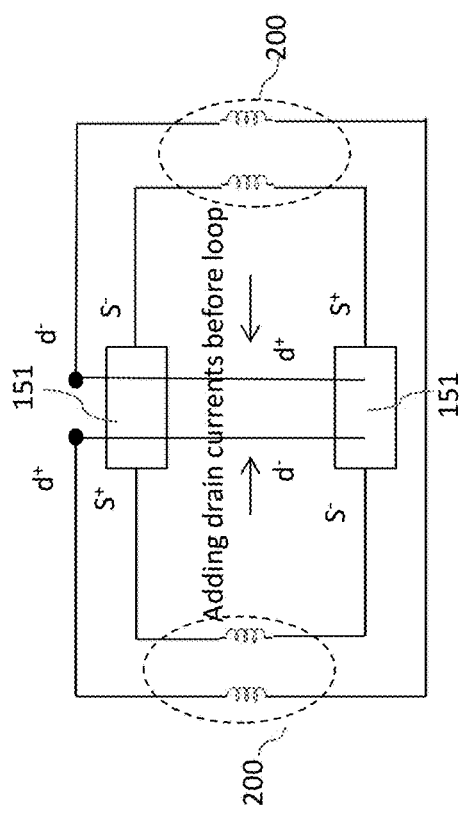
FIG. 8 is a diagram of showing where drain currents are added before the loop in a VCO in accordance with the present invention.

FIG. 8 is a diagram showing where drain currents of two active devices are added before the loop in a VCO 800 in accordance with the present invention. In so doing, the drain currents of the two devices are added first and the drains are coupled to the source in a positive feedback manner. Similarly all or few similar polarity source nodes from each differential active device to other differential active devices can connect together without altering present invention.

Figure 9:
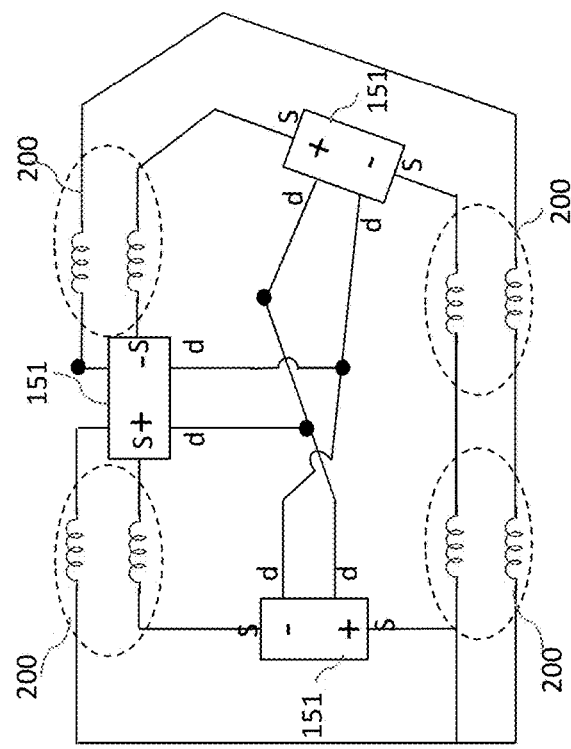
FIG. 9 is a diagram of showing where drain currents are added after the loop in a VCO in accordance with the present invention.

FIG. 9 is a diagram showing where drain currents are added before the loop in a VCO 900 in accordance with the present invention. In so doing, the drain currents are added first and the three drains are coupled to the source in a positive feedback manner. Similarly all or few similar polarity source nodes from each differential active device to other differential active devices can connect together without altering present invention.

A system and method in accordance with the present invention provides a amplifier circuit that can be combined with a transformer to obtain increased gain and positive feedback for voltage controlled oscillator (VCO) applications. The resulting device does not require a buffer or memory and therefore is smaller in size and uses less power than conventional VCOs.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the present invention.

What is claimed is:

1. A voltage controlled oscillator (VCO) comprising:
an active device, wherein the active device further includes an n-type transistor having a drain, gate and bulk; a p-type transistor having a drain, gate and bulk; wherein the n-type transistor and the p-type transistor share a common source; a first capacitor coupled between the gate of n-type transistor and the gate of p-type transistor; a second capacitor coupled between the drain of the n-type transistor and the drain of p-type transistor; and a third capacitor coupled between the bulk of n-type transistor and the bulk of p-type transistor;
a tuning block coupled to the common source to form a common gate amplifier; and
at least one tuning element coupled to the active device for changing the overall capacitance of the VCO; wherein the VCO has a high breakdown voltage, is memory less and traps even harmonic signals.

2. The VCO of claim 1, wherein each of the first, second and third capacitors comprises any of a variable capacitor, a capacitor coupled in series with a resistor, a capacitor coupled in parallel with a resistor; a capacitor coupled serially with an inductor, a capacitor coupled in parallel with an inductor.

3. The VCO of claim 1, wherein the at least tuning element includes any of inductors, capacitors, resistors and transformers which comprises two inputs and one output.

4. A differential voltage controlled oscillator (VCO) comprising:
first and second active devices; wherein each of the first and second active devices further includes an n type transistor having a drain, gate and bulk; a p-type transistor having a drain, gate and bulk; wherein the n-type transistor and the p-type transistor share a common source; a first capacitor coupled between the gate of n-type transistor and the gate of p-type transistor; a second capacitor coupled between the drain of the n-type transistor and the drain of p-type transistor; and a third capacitor coupled between the bulk of n-type transistor and the bulk of p-type transistor;
a fourth capacitor coupled between the bulk of the n-type transistor of first active device to shared source of second active device;
a fifth capacitor coupled between bulk of p-type transistor of first active device to shard source of second active device;
a sixth capacitor coupled between the bulk n-type transistor of second active device to shared source of first active device;
a seventh capacitor coupled between the bulk of p-type transistor of second active device to shared source of first active device;
a tuning block coupled to the common source to form a common gate amplifier;
at least one first tuning device coupled between the drain of the n-type transistor of the first active device and the drain of the n-type transistor of the second active device;
at least one second tuning device coupled between the sources of the n-type and p-type transistors of the first active device and the sources of the n-type and p-type transistors of the second active device; and
at least one third tuning device coupled between the drain of the p-type transistor of the first active device and the drain of the p-type transistor of the second first active device; wherein the differential VCO has a high breakdown voltage, is memory less and traps even harmonic signals.

5. The differential VCO of claim 4, wherein each of the first, second and third capacitors comprises any of a variable capacitor, a capacitor coupled in series with a resistor, a capacitor coupled in parallel with a resistor; a capacitor coupled serially with an inductor, a capacitor coupled in parallel with an inductor.

6. The differential VCO of claim 4, wherein each of the first, second and third tuning elements includes any of inductors, capacitors, resistors and transformers which comprises two inputs and one output.

7. The differential VCO of claim 4, wherein the first and second tuning elements are utilized for coarse tuning of the VCO and the second tuning element is utilized for fine tuning of the VCO.

* * * * *